(12) United States Patent
Chakraborty (10) Patent No.: US 9,373,770 B2
(45) Date of Patent: Jun. 21, 2016

(54) INDUSTRIAL THERMOELECTRIC GENERATOR

(75) Inventor: Swapan Chakraborty, Shakopee, MN (US)

(73) Assignee: Rosemount Inc., Eden Prairie, MN (US)

( * ) Notice: Subject to any disclaimer, the term of this patent is extended or adjusted under 35 U.S.C. 154(b) by 857 days.

(21) Appl. No.: 11/906,034

(22) Filed: Sep. 28, 2007

(65) Prior Publication Data

US 2008/0078434 A1 Apr. 3, 2008

Related U.S. Application Data

(60) Provisional application No. 60/847,972, filed on Sep. 28, 2006.

(51) Int. Cl.
*H01L 35/32* (2006.01)
*H01L 35/10* (2006.01)

(52) U.S. Cl.
CPC ............. *H01L 35/32* (2013.01); *H01L 35/10* (2013.01)

(58) Field of Classification Search
CPC ......... H01L 35/32; H01L 35/02; H01L 35/04; H01L 35/06; H01L 35/08; H01L 35/10
USPC .................................................. 136/205, 208
See application file for complete search history.

(56) References Cited

U.S. PATENT DOCUMENTS

| | | | | |
|---|---|---|---|---|
| 3,615,869 A | * | 10/1971 | Barker et al. | 136/236.1 |
| 3,661,653 A | * | 5/1972 | Purdy et al. | 136/212 |
| 3,833,428 A | * | 9/1974 | Snyder et al. | 136/202 |
| 4,056,406 A | * | 11/1977 | Markman et al. | 136/208 |
| 4,459,428 A | * | 7/1984 | Chou | 136/211 |
| 4,520,305 A | * | 5/1985 | Cauchy | 322/2 R |
| 4,734,139 A | | 3/1988 | Shakun et al. | 136/210 |
| 5,228,923 A | * | 7/1993 | Hed | H01L 35/32 136/203 |
| 5,385,020 A | * | 1/1995 | Gwilliam et al. | 62/3.7 |
| 5,419,780 A | * | 5/1995 | Suski | 136/205 |

(Continued)

FOREIGN PATENT DOCUMENTS

| FR | 2646021 | * | 4/1989 |
|---|---|---|---|
| GB | 2145876 A | | 4/1985 |

(Continued)

OTHER PUBLICATIONS

Machine translation of FR2646021, pub. Apr. 1989.*

(Continued)

*Primary Examiner* — Allison Bourke
(74) *Attorney, Agent, or Firm* — Westman, Champlin & Koehler, P.A (57) ABSTRACT

An industrial thermoelectric generation assembly and method are provided. A plurality of thermoelectric generation elements is provided. Each element has a first side, a second side opposite the first side, and a lateral surface. A thermally insulative material surrounds the lateral surface of each thermoelectric element. The first side of each thermoelectric element is disposed to contact a process heat source, and the second side is configured to be exposed to an ambient environment. At least two of the plurality of thermoelectric generation elements are wired in series. The thermoelectric generation elements, being good thermal insulators, provide good thermal insulation to the process. Withholding heat within the process (which is desired), is converted to electricity.

16 Claims, 6 Drawing Sheets

(56) References Cited

U.S. PATENT DOCUMENTS

| | | | |
|---|---|---|---|
| 5,892,656 A * | 4/1999 | Bass | 361/699 |
| 6,166,317 A * | 12/2000 | Volk, Jr. | 136/201 |
| 6,252,154 B1 * | 6/2001 | Kamada et al. | 136/201 |
| 6,297,441 B1 * | 10/2001 | Macris | H01L 35/32 136/201 |
| 6,624,349 B1 * | 9/2003 | Bass | 136/205 |
| 7,765,811 B2 * | 8/2010 | Hershberger | F25B 21/02 136/203 |
| 2003/0047204 A1 | 3/2003 | Fleurial et al. | |
| 2003/0084935 A1 * | 5/2003 | Bell | H01L 35/32 136/200 |
| 2004/0107987 A1 * | 6/2004 | Ciray et al. | 136/205 |
| 2004/0238022 A1 * | 12/2004 | Hiller et al. | 136/203 |
| 2005/0208908 A1 * | 9/2005 | Karschnia et al. | 455/127.1 |
| 2006/0102224 A1 * | 5/2006 | Chen et al. | 136/203 |
| 2006/0136099 A1 * | 6/2006 | Hajiaghajani et al. | 700/272 |
| 2011/0220162 A1 * | 9/2011 | Siivola | H01L 35/32 136/203 |

FOREIGN PATENT DOCUMENTS

| | | |
|---|---|---|
| JP | 05168264 | 7/1993 |
| JP | 11036981 | 2/1999 |
| JP | 11087786 | 3/1999 |
| JP | 2001349763 | 12/2001 |
| JP | 2003219670 | 7/2003 |
| JP | 2006165273 | 6/2006 |
| WO | WO 88/05964 | 8/1988 |
| WO | WO 91/11029 | 7/1991 |
| WO | WO 2007/098151 | 8/2007 |

OTHER PUBLICATIONS

First Office Action for the Chinese application No. 200780035867.9 dated Jun. 11, 2010.

International Search Report and Written Opinion from application PCT/US2007/020994, filed Sep. 28, 2007.

Auckland, D.W. et al., "Design of a semiconductor thermoelectric generator for remote subsea wellheads," iEE Proc.-Electr. Power Appl., vol. 142, No. 2, p. 65-70 (Mar. 1995).

First Office Action for the corresponding Japanese patent application No. 2009530450 dated Nov. 1, 2011.

Second Office Action for the corresponding Japanese patent application No. 2009530450 dated May 22, 2012.

First Communication from corresponding European patent application No. 07839040.8 dated Dec. 11, 2012.

"Designs of a Semiconductor thermoelectric generator for remote subsea wellheads," IEEE Proceedings, Electric Power Applications, Institution of Electrical Engineers, GB, vol. 142, No. 2. Mar. 1, 1995. pp. 65-70, XP006004060 ISSN: 1350-2352. Abstract Only.

First Examination Report dated Feb. 28, 2014 in related Indian Patent Application No. 642/MUMNP/2009, filed Mar. 31, 2009. 2 pgs. English Translation.

* cited by examiner

INDUSTRIAL THERMOELECTRIC GENERATOR

CROSS-REFERENCE TO RELATED APPLICATION

The present application is based on and claims the benefit of U.S. provisional patent application Ser. No. 60/847,972, filed Sep. 28, 2006, the content of which is hereby incorporated by reference in its entirety.

BACKGROUND

Industrial processes generate an enormous amount of thermal energy. According to at least one survey, the amount of heat generated in the chemical industry, petroleum refineries, and forest product industries within the United States of America is on the order of approximately 6,000 trillion Btu's. That number does not include heat generated in other processes and industries, such as boiler, food, energy, metal and metallurgy, heating ventilation and air conditioning (HVAC) and many other industries. 6,000 trillion Btu's is equivalent to approximately 5 billion U.S. dollars. Out of the 6,000 trillion Btu's, it is believed that only 52% are utilized, and the remaining energy is wasted, or otherwise lost to the environment.

Large-scale thermoelectric generators are known. For example, U.S. Pat. No. 4,734,139 provides a thermoelectric generator module which is formed with a hot side heat exchanger in contact with a series of individual thermoelectric semiconductor modules. The semiconductor modules are arranged such that heat flows through the modules. Each semiconductor module is electrically coupled so that their output may be combined to produce a large quantity of electrical power.

Thermoelectric materials, in accordance with known physical concepts, generate an electrical current flow in response to a thermal gradient across the thermoelectric generator.

In industrial environments, hot processes are generally insulated in order to inhibit, or otherwise minimize, unwanted heat flowing from the hot process. This thermal insulation increases the efficiency of the process, while simultaneously facilitating safety of the installation itself. The insulation may be made of several layers of thermal insulators. The thickness of the insulation can vary often between a couple of inches to tens of inches, depending upon the requirements.

While it would be useful to utilize thermoelectrical generators to convert all otherwise wasted industrial thermal energy to electricity, the real-world needs for thermal insulation generally inhibit heat flow to such an extent that simple application of thermoelectrical generation principles to processes is cost prohibitive. Moreover, providing a thermal insulator in the heat flow path of a thermoelectric generator reduces the thermal gradient across the thermoelectric generator, and accordingly reduces generation efficiency.

Providing an industrial, large-scale, thermoelectric generator that is able to provide large quantities of electricity, while simultaneously providing thermally insulative properties to a process would represent an important step in both increasing process efficiencies, while reclaiming otherwise lost energy.

SUMMARY

An industrial thermoelectric generation assembly and method are provided. A plurality of thermoelectric generation elements is provided. Each element has a first side, a second side opposite the first side, and a lateral surface. A thermally insulative material surrounds the lateral surface of each thermoelectric element. The first side of each thermoelectric element is disposed to contact a process heat source, and the second side is configured to be exposed to an ambient environment. At least two of the plurality of thermoelectric generation elements are wired in series. The thermoelectric generation elements, being good thermal insulators, provide good thermal insulation to the process. Withholding heat within the process (which is desired), is converted to electricity.

DETAILED DESCRIPTION

Figure 1:
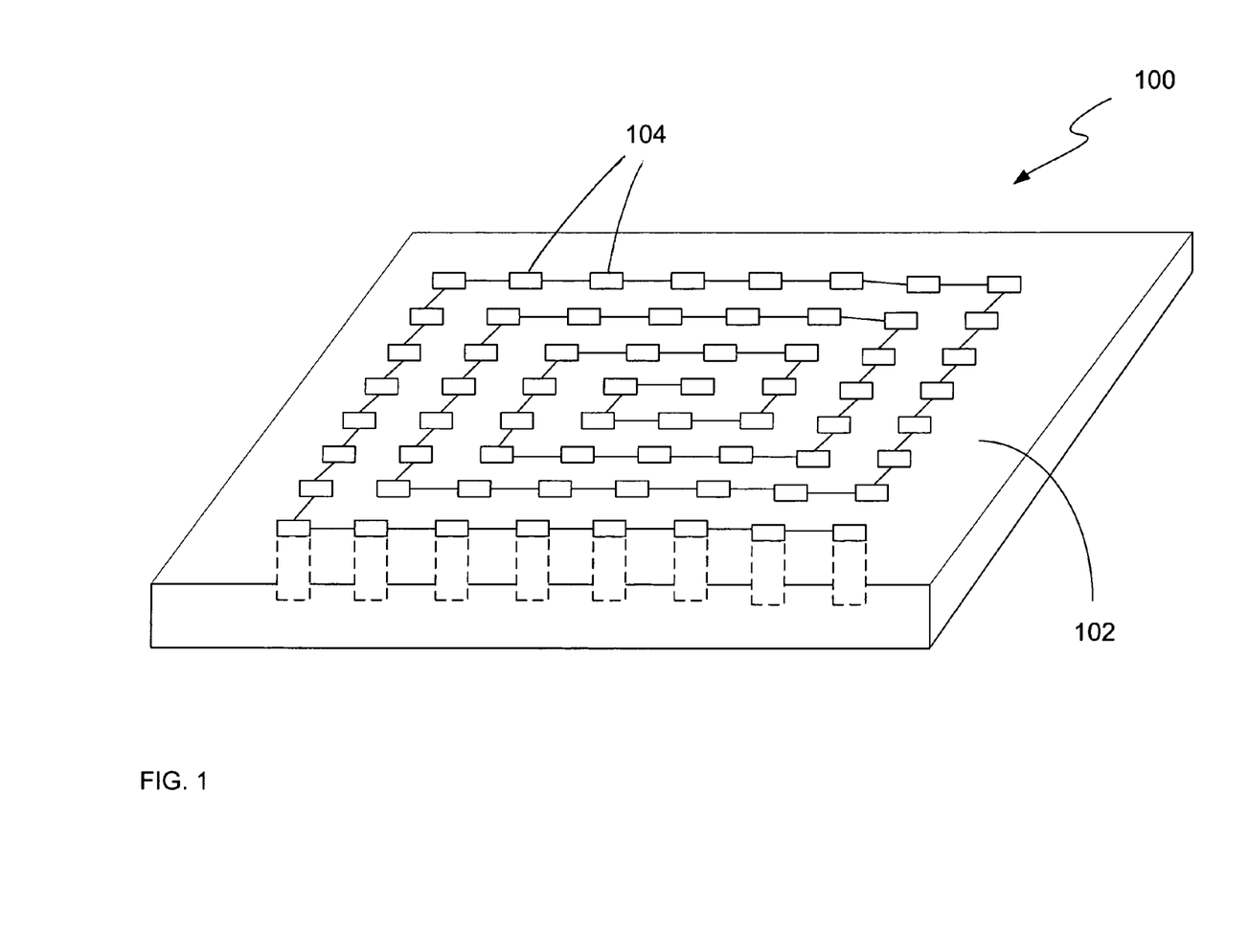
FIG. 1 is a diagrammatic view of an insulative thermoelectric industrial generator in accordance with an embodiment of the present invention.

FIG. 1 is a diagrammatic view of an insulative thermoelectric industrial generator in accordance with an embodiment of the present invention. Generator 100 includes a plurality of discrete thermoelectric generation modules disposed proximate and encapsulated within insulation layer 102. As indicated in FIG. 1, there may be a substantial number of thermoelectric modules 104 embedded within insulation layer 102. Examples of suitable materials to be used for thermoelectric generation modules 104 include group III, group IV, and group V semiconducting elements. These materials are particularly useful for thermoelectric generation in that they are also good thermal insulators. Further, by surrounding the thermoelectric generation modules 104 with insulation module 102, heat from the industrial heat source, such as a chemical bath, or hot pipe is essentially focused such that it flows through the thermal generation modules 104. Additionally, the utilization of a relatively large number of discrete thermoelectric generation modules 104 helps ensure that the overall assembly 100 is relatively flexible and can be fit to various shapes.

Figure 2:
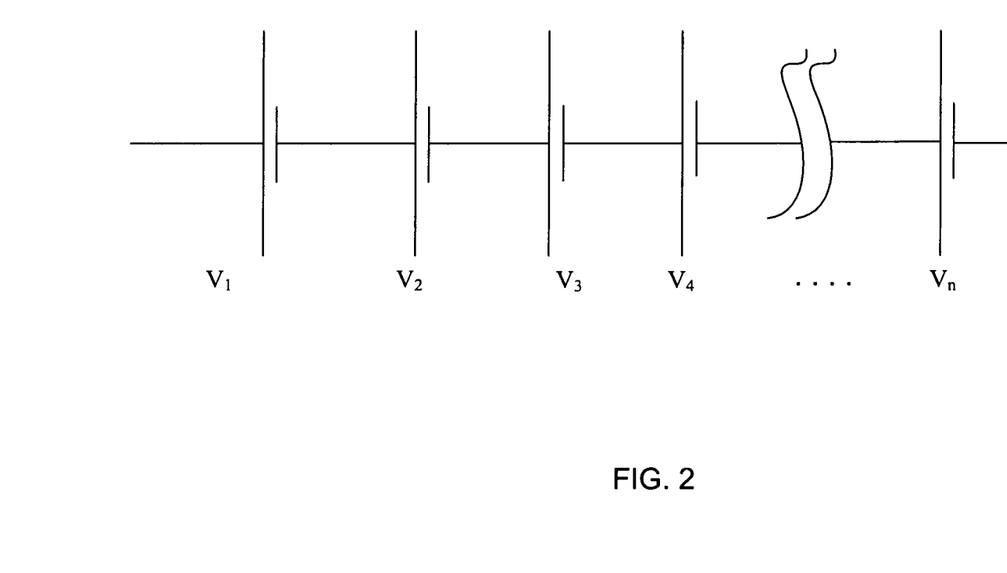
FIG. 2 is a schematic diagram of a number of thermoelectric generation modules connected in series.

FIG. 2 is a schematic diagram of a number of thermoelectric generation modules connected in series. By placing a number of thermoelectric generation modules 104 in series, the total power available from the circuit is the addition of that available from each thermoelectric generation module 104. Additionally, voltage and/or current flow can be tailored by arranging a suitable number of thermoelectric generation modules 104 in series, and then arranging the combined series circuits in parallel with one another. This essentially generates a matrix of thermoelectric generation modules 104.

Figure 3:
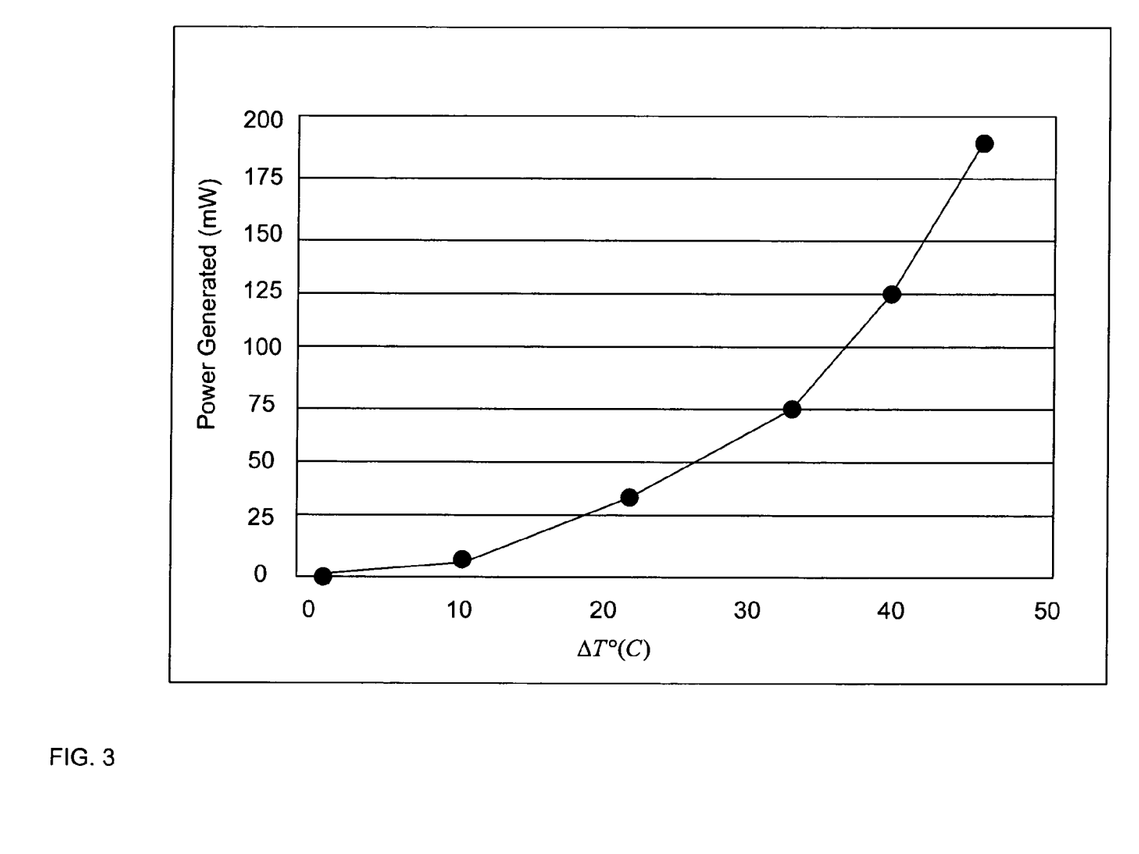
FIG. 3 is a chart of power generated from four thermoelectric generation modules relative to different thermal gradients.

FIG. 3 is a chart of power generated from four thermoelectric generation modules relative to different thermal gradients. FIG. 3 indicates that four thermoelectric generation modules, combined, can generate a total of 183 milliwatts at 4.4 volts with a thermal gradient of approximately 50° C. This means that each solid state thermoelectric generation module produces 45.75 milliwatts at 1.1 volts with a thermal gradient of 50° C. Extrapolating those numbers, for an insulative thermoelectric generation module 100 that is 1 meter long, 20 thermoelectric generation modules 104 can be embedded in one particular row or line. For a 1 foot diameter pipe, the periphery would be approximately 38 inches. Across the periphery, 20 thermoelectric generation modules 104 can be embedded in the column. Therefore, an entire matrix comprised of 20 thermoelectric generation modules long by 20 thermoelectric generation modules wide provides 400 thermoelectric generation modules 104 cooperating together. The generated power is estimated to be: 45.75 milliwatts× 400=1.83 kilowatts. Further, the voltage is estimated to be: 1.1 volts×400=440 volts. That is substantial industrial power generation.

Figure 4:
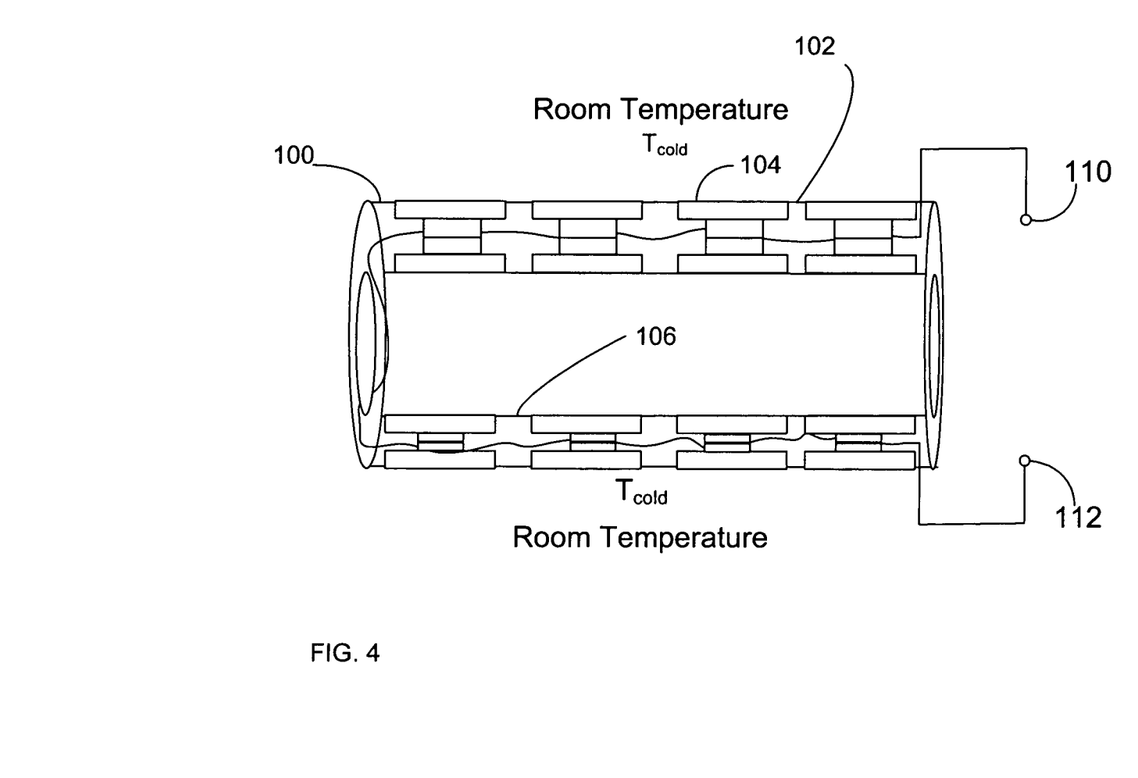
FIG. 4 is a diagrammatic view of a thermoelectric generation assembly disposed about a process fluid conduit in accordance with an embodiment of the present invention.

FIG. 4 is a diagrammatic view of assembly 100 disposed about a process fluid conduit in accordance with an embodiment of the present invention. Assembly 100 is disposed about outer periphery of pipe 106, which conveys a relatively hot process fluid (process fluid being a process gas, process liquid, or some combination thereof). The process fluid within pipe 106 is at an elevated temperature relative to room temperature. The elevated temperature is indicated in FIG. 4 as $T_{hot}$. Additionally, the room temperature is indicated as $T_{cold}$. As illustrated in FIG. 4, each of thermoelectric generation modules 104 has a first surface that is in direct contact with pipe and according is maintained at temperature $T_{hot}$. Each thermoelectric generation module also includes a second surface, opposite the first surface. The second surface contacts the ambient environment $T_{cold}$. Each thermoelectric module has a lateral surface extending between the first and second surface that is in direct contact with a thermally insulative material. Accordingly each thermoelectric module 104 provides a direct thermal path from contact with process fluid conduit 106 to ambient environment 108. The entire thermal gradient ($T_{hot}$-$T_{cold}$) operates upon and generates electricity by virtue of thermoelectric generation modules 104. Insulation 102 is disposed between thermoelectric generation modules 104 and helps ensure that all thermal energy flowing from process fluid conduit 106 passes through a thermoelectric generation modules 104. The electrical coupling of the various thermoelectric generation modules 104 together provides a pair of terminals 110, 112 that provide access to power generated by the cooperating thermoelectric generation modules 104.

Terminals 110, 112 can be coupled to a local device disposed proximate system 100 to perform some desired function. For example, terminals 110, 112 can be coupled to a field device to power the field device. This is particularly advantageous for field devices that communicate wirelessly. However, given the substantial amount of power that is available from system 100, it is conceivable that terminals 110, 112 can be coupled to a suitable intrinsic safety barrier and used to essentially power an entire wired process communication loop, where some node on the process communication loop communicates wirelessly. Accordingly, system 100 can essentially power one or a large number of field devices.

Field devices are known devices that operate in industrial settings, such as petroleum refineries, and chemical processing facilities, to facilitate control of the process. Examples of field devices include process pressure transmitters, process temperature transmitters, process fluid flow transmitters, process level transmitters, valve actuators, solenoids, et cetera.

In accordance with another embodiment of the present invention, terminals 110, 112 can also be coupled to a storage facility, such as a bank of batteries, or capacitors. In this regard, thermal energy transformed, by thermoelectric generation modules 104, into electricity can be stored for later use. Examples of such later use include reversing the operation of the thermoelectric generation modules 104 by passing the stored electricity through the individual thermoelectric generation modules 104 to effect thermal control of the process fluid flowing within conduit 106. Thus, for example, as the process operates during steady-state conditions, any thermal losses that would otherwise have wasted, can be converted into energy stored for later use. Later, if the process needs to be restarted, and the process fluid within conduit 106 needs to be heated, the stored energy can be essentially returned to the process fluid conduit 106 to more quickly heat the process fluid flowing therein.

Figure 5:
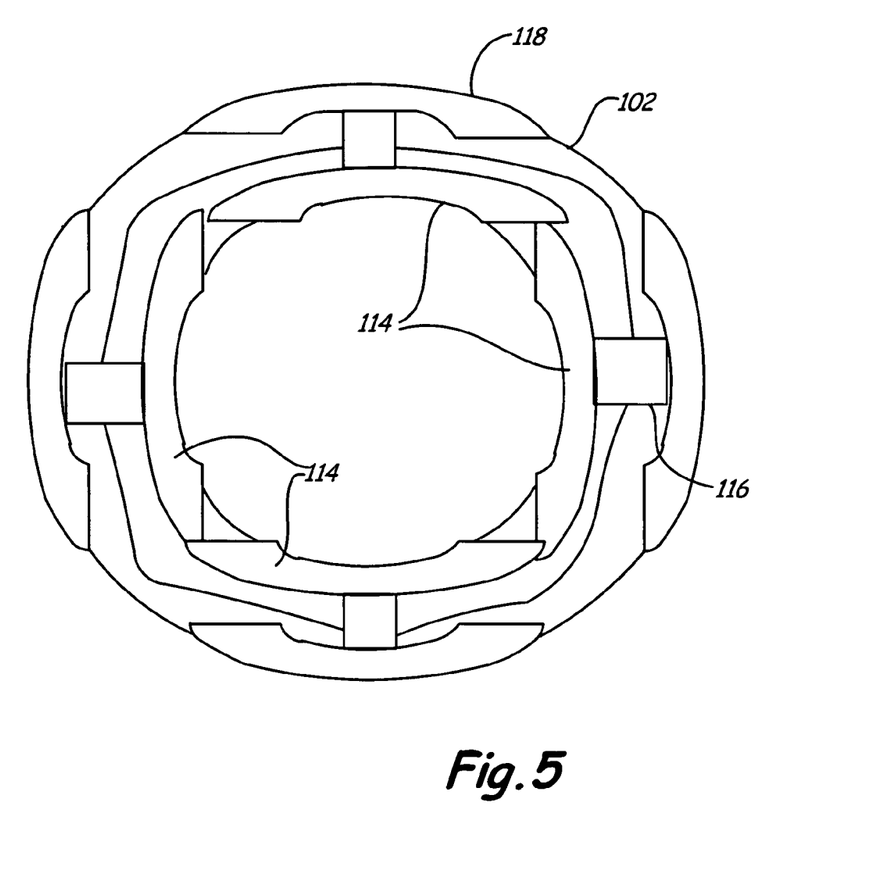
FIG. 5 is a cross-sectional view of the system illustrated in FIG. 4.

FIG. 5 is a cross-sectional view of the system illustrated in FIG. 4. FIG. 5 illustrates a number of heat conductor plates 114 coupled to individual thermoelectric generation elements 116, which thermoelectric generation elements 116 are then coupled to cold-side thermal conductors 118. Thermal insulation 102 surrounds thermal conductors 114 and 116 such that the primary flow of heat through the system is via thermoelectric generation elements 116. Certainly, for heat sources that have very simple geometries, such as the flat side of a large chemical bath, the utilization of conductors 114, 118 may be vastly simplified, or even eliminated.

Thermal insulation material 102 can take any suitable form. Preferably, thermal insulation material 102 is not electrically conductive, and is selected to withstand the maximum temperature at which the process fluid conduit is expected to operate. Very high-temperature examples of insulation 106 include ceramics in both solid and fabric form, as well as other inorganic thermal insulators. Additionally, for lower-temperature operations, various polymers can be used. Suitable examples of such polymers include neoprene and/or silicone rubber.

Figure 6:
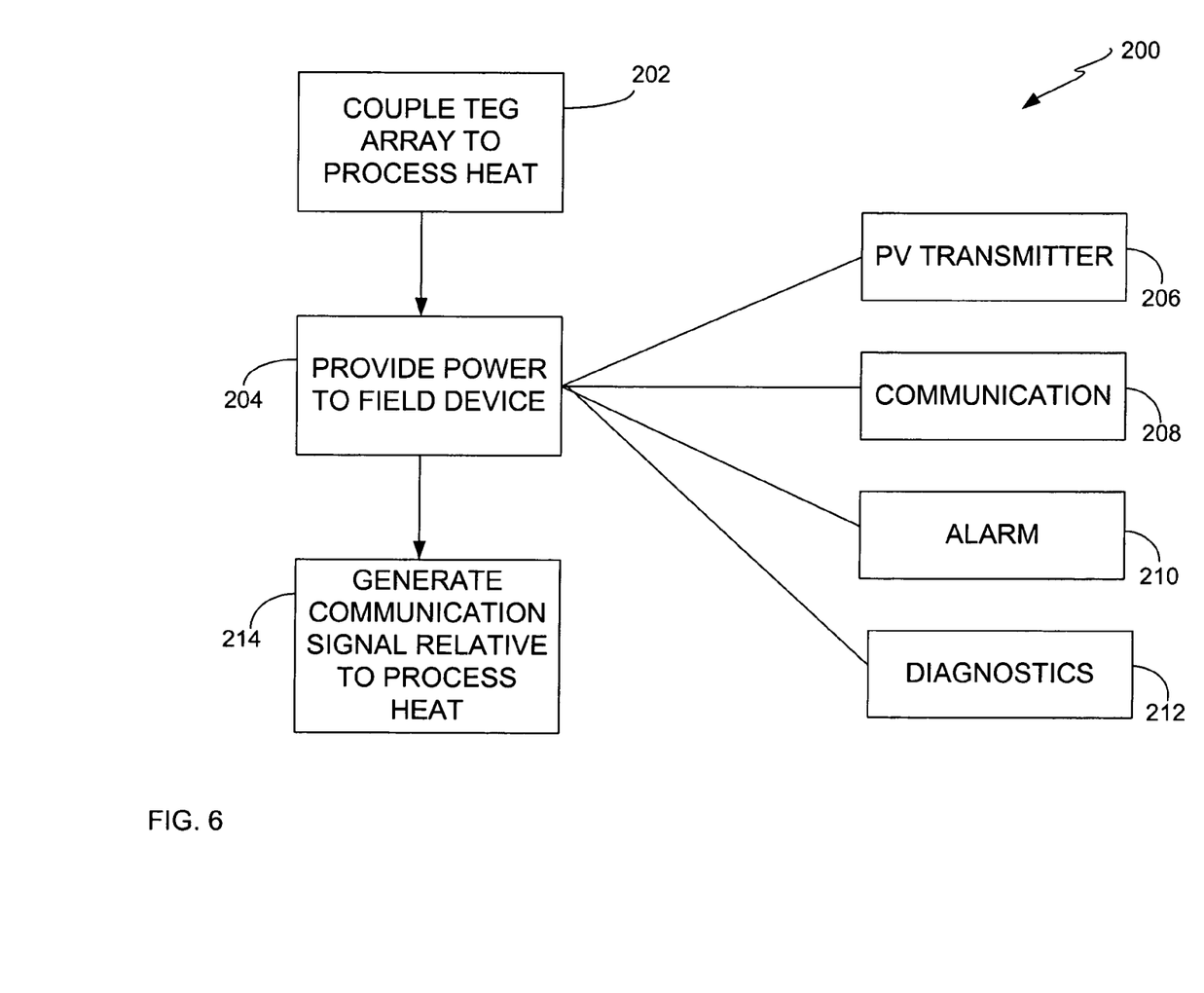
FIG. 6 is a flow diagram of a method of utilizing a thermoelectric generation array in accordance with an embodiment of the present invention.

FIG. 6 is a flow diagram of a method of utilizing a thermoelectric generation array in accordance with an embodiment of the present invention. Method 200 begins at block 202. At block 202 an insulative thermoelectric generation array is thermally coupled to a source of process heat. As set forth above, sources of process heat can include elevated temperature thermal baths, process fluid conduits or vessels carrying or storing process fluid at an elevated temperature, or other suitable heat sources. At block 204, the thermoelectric generation array generates power and provides such power to at least one attached field device. This is illustrated at block 204. The field device can be a process variable transmitter, block 206; a communication device adapted to communicate either wirelessly or via a wired process communication protocol, as illustrated at block 208; an alarm (either a local alarm generating a visual and/or audible alarm, or generating an alarm signal via a process communication signal), as illustrated at block 210; and/or a diagnostics device that is able to execute a suitable algorithm or calculation to provide meaningful diagnostic information relative to an input signal, as illustrated at block 212. Then, at block 214, the attached field device generates a communication signal that is indicative of some aspect of process heat. Since the energization signal from the thermoelectric generation array is based upon the differential temperature between the process heat source and the ambient environment, the actual level of power available can be used by the field device as a diagnostic input. Additionally, or alternatively, the field device may simply use a temperature sensor coupled to the process heat source to measure the temperature directly. Further, other suitable process variables and/or relevant information can be communicated by the field device.

Although the present invention has been described with reference to preferred embodiments, workers skilled in the art will recognize that changes may be made in form and detail without departing from the spirit and scope of the invention. For example, while the thermoelectric generation modules have generally been described with respect to solid state modules, nano-scale thermoelectric materials can also be used, such as paints or coatings.

What is claimed is:

1. An industrial thermoelectric generation assembly comprising:
   a flexible thermal insulation layer comprising a first side and a second side opposite the first side that define a thickness of the thermal insulation layer and the thermal insulation layer having a periphery so that the thermal insulation layer forms a sheet; and
   a plurality of thermoelectric generation modules disposed within the thermal insulation layer, each module extending between the first and second sides of the thermal insulation layer, and having a first side corresponding to the first side of the thermal insulation layer and a second side corresponding to the second side of the thermal insulation layer;
   a plurality of hot side plates which directly physically contact and thermally couple the first sides of the plurality of thermoelectric generation modules to a heat source and have an outermost surface that is in alignment with the first side of the thermal insulation layer;
   a plurality of cold side plates which directly physically contact and thermally couple the second sides of the plurality of thermoelectric generation modules and have an outermost surface that is in alignment with the second side of the thermal insulation layer;
   wherein:
      a portion of each module extending between the first and second sides of the module is surrounded by the thermal insulation layer;
      the first side of each thermoelectric generation module is disposed to thermally contact the process heat source through the hot side plates, and the second side is configured to be exposed to an ambient environment temperature through the cold side plates;
      at least a portion of the plurality of thermoelectric generation modules are wired in series through the thermal insulation layer, wherein the portion of the plurality of thermoelectric generation modules that are wired in series through the thermal insulation are disposed in the thermal insulation layer in a spiral arrangement so that a first thermoelectric generation module in the series is located through an interior of the thermal insulation layer and each subsequent thermoelectric generation module in the series is located closer to the periphery of the thermal insulation layer that the first thermoelectric generation module; and
      the modules are supported in the thermal insulation layer and spaced from each other by the thermal insulation layer, whereby the industrial thermoelectric generation assembly is flexible so that the first side of the thermal insulation layer fits against a planar surface in a first configuration and the first side of the thermal insulation fits against a non-planar surface in a second configuration.

2. The industrial thermoelectric generation assembly of claim 1, wherein at least one of the thermoelectric generation modules is a nano-scale thermoelectric generation module.

3. The industrial thermoelectric generation assembly of claim 1, wherein the process heat source is selected from the group consisting of a bath, a process fluid conduit, a heat exchanger, a heat flow, a process fluid vessel, and a hot water line.

4. The industrial thermoelectric generation assembly of claim 1, and further comprising at least one field device operably coupled to the plurality of thermoelectric generation modules, the at least one field device being powered by electricity provided by the plurality of thermoelectric modules.

5. The industrial thermoelectric generation assembly of claim 4, wherein the field device provides process communication.

6. The industrial thermoelectric generation assembly of claim 4, wherein the field device is a process variable transmitter.

7. The industrial thermoelectric generation assembly of claim 4, wherein the field device provides a diagnostic function relative to the process heat source.

8. The industrial thermoelectric generation assembly of claim 4, wherein the field device provides an alarm relative to the process heat source.

9. The industrial thermoelectric generation assembly of claim 1, and further comprising an electrical storage device operably coupled to the plurality of thermoelectric generation modules.

10. The industrial thermoelectric generation assembly of claim 9, wherein the electrical storage device includes at least one rechargeable battery.

11. The industrial thermoelectric generation assembly of claim 1, wherein the assembly generates about 1.8 kilowatts.

12. The industrial thermoelectric generation assembly of claim 1, wherein each thermoelectric generation module is a solid state thermoelectric generation module.

13. The industrial thermoelectric generation assembly of claim 12, wherein each thermoelectric generation module produces about 45 milliwatts when exposed to a thermal gradient of about 50 degrees Celsius.

14. The industrial thermoelectric generation assembly of claim 1, wherein the thermoelectric generation modules are embedded in the thermal insulation layer.

15. The thermoelectric generation assembly of claim 1, wherein each thermoelectric generation module provides a direct thermal path between the process heat source and the ambient environment.

16. A thermoelectric generation assembly comprising:
   flexible thermal insulation having a periphery, a first side and an opposing second side, wherein the first side and the second side define a thickness of the flexible thermal insulation;
   a plurality of thermoelectric generation modules disposed within the flexible thermal insulation, each thermoelectric generation module including a hot side plate having an outermost surface and a cold side plate having an outermost surface and each thermoelectric generation module extending between the first and second sides of the flexible thermal insulation so that the outermost surface of the hot side plate is in alignment with the first side of the flexible thermally insulative fabric and the outermost surface of the cold side plate is in alignment with the second side of the flexible thermal insulation, wherein a portion of the plurality of thermoelectric generation modules are wired in series through the flexible thermal insulation and are disposed in the flexible thermal insulation in a spiral arrangement so that a first thermoelectric generation module in the series is located through an interior of the flexible thermal insulation and each subsequent thermoelectric module in the series is located closer to the periphery of the flexible thermal insulation than the first thermoelectric generation module;

wherein the thermoelectric generation modules are spaced apart from each other and contained in the flexible thermal insulation such that the first side of the of the flexible thermal insulation fits against a planar surface in one configuration of the thermoelectric generation assembly and fits against a non-planar surface in a second configuration of the thermoelectric generation assembly; and wherein each hot side plate of each thermoelectric generation module contacts a heat source and each cold side plate of each thermoelectric generation modules module is exposed to an ambient environment.

* * * * *